US010211033B2

United States Patent
Nguyen et al.

(10) Patent No.: US 10,211,033 B2
(45) Date of Patent: Feb. 19, 2019

(54) INLINE DPS CHAMBER HARDWARE ARE DESIGN TO ENABLE AXIS SYMMETRY FOR IMPROVED FLOW CONDUCTANCE AND UNIFORMITY

(71) Applicant: Applied Materials, Inc., Santa Clara, CA (US)

(72) Inventors: Andrew Nguyen, San Jose, CA (US); Yogananda Sarode Vishwanath, Bangalore (IN); Tom K. Cho, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 14/612,263

(22) Filed: Feb. 2, 2015

(65) Prior Publication Data
US 2015/0218697 A1 Aug. 6, 2015

Related U.S. Application Data

(60) Provisional application No. 61/936,423, filed on Feb. 6, 2014.

(51) Int. Cl.
*C23C 16/50* (2006.01)
*H01J 37/32* (2006.01)
*C23C 16/458* (2006.01)

(52) U.S. Cl.
CPC ...... *H01J 37/32834* (2013.01); *C23C 16/458* (2013.01); *H01J 37/321* (2013.01); *H01J 37/32449* (2013.01); *H01J 37/32623* (2013.01)

(58) Field of Classification Search
CPC .............. H01J 37/32834; H01J 37/321; H01J 37/32623; H01J 37/32449; H01J 37/32715; H01J 37/32431
See application file for complete search history.

(56) References Cited

U.S. PATENT DOCUMENTS

| 5,948,704 A | * | 9/1999 | Benjamin | H01J 37/20 118/723 R |
| 6,277,237 B1 | * | 8/2001 | Schoepp | H01J 37/32495 118/723 R |

(Continued)

FOREIGN PATENT DOCUMENTS

| EP | 1 959 489 A2 | 8/2008 |
| WO | 02/05308 A2 | 1/2002 |

OTHER PUBLICATIONS

PCT Notification of Transmittal of the International Search Report and the Written Opinion of the International Searching Authority for International Application No. PCT/US2015/010652 dated Apr. 29, 2015; 13 total pages.

(Continued)

*Primary Examiner* — Rakesh K Dhingra
*Assistant Examiner* — Laureen Chan
(74) *Attorney, Agent, or Firm* — Patterson + Sheridan, LLP

(57) ABSTRACT

The present disclosure generally relates to apparatus and methods for symmetry in electrical field, gas flow and thermal distribution in a processing chamber to achieve process uniformity. Embodiment of the present disclosure includes a plasma processing chamber having a plasma source, a substrate support assembly and a vacuum pump aligned along the same central axis to create substantially symmetrical flow paths, electrical field, and thermal distribution in the plasma processing chamber resulting in improved process uniformity and reduced skew.

20 Claims, 7 Drawing Sheets

(56) References Cited

U.S. PATENT DOCUMENTS

| | | | | |
|---|---|---|---|---|
| 7,011,039 | B1* | 3/2006 | Mohn | H01J 37/321 |
| | | | | 118/723 R |
| 7,232,502 | B2* | 6/2007 | Iizuka | C23C 16/4412 |
| | | | | 118/728 |
| 2003/0205329 | A1* | 11/2003 | Gujer | C23C 16/405 |
| | | | | 156/345.51 |
| 2005/0126484 | A1 | 6/2005 | Zhao et al. | |
| 2006/0157201 | A1 | 7/2006 | Hoffman et al. | |
| 2008/0190364 | A1* | 8/2008 | Mahon | H01L 21/6831 |
| | | | | 118/500 |
| 2009/0008369 | A1* | 1/2009 | Nozawa | C23C 16/4412 |
| | | | | 219/121.54 |
| 2010/0186672 | A1* | 7/2010 | Okuda | C23C 16/4586 |
| | | | | 118/723 R |
| 2013/0087286 | A1 | 4/2013 | Carducci et al. | |
| 2013/0128409 | A1* | 5/2013 | Nam | H01L 21/6831 |
| | | | | 361/234 |
| 2013/0244440 | A1* | 9/2013 | McChesney | H01J 37/32477 |
| | | | | 438/719 |
| 2013/0330763 | A1 | 12/2013 | Graves et al. | |
| 2013/0340938 | A1 | 12/2013 | Tappan et al. | |

OTHER PUBLICATIONS

Taiwanese Office Action (with attached English translation of the Search Report) for Application No. 104102861; dated Jun. 12, 2018; 10 total pages.

Chinese Office Action (with attached English translation) for Application No. 201580001473.6; dated Jul. 31, 2018; 13 total pages.

* cited by examiner

INLINE DPS CHAMBER HARDWARE ARE DESIGN TO ENABLE AXIS SYMMETRY FOR IMPROVED FLOW CONDUCTANCE AND UNIFORMITY

CROSS-REFERENCE TO RELATED APPLICATIONS

This application claims priority to U.S. Provisional Patent Application Ser. No. 61/936,423, filed on Feb. 6, 2014, which herein is incorporated by reference.

BACKGROUND

Field

Embodiments of the present disclosure relate to apparatus and methods for processing semiconductor substrates. More particularly, embodiments of the present disclosure relate to apparatus and methods for improving symmetry in electrical field, gas flow and thermal distribution in a processing chamber to achieve process uniformity.

Description of the Related Art

Conventional semiconductor processing chambers, such as plasma etch chambers, may have off-set pump design with a substrate support and a plasma/gas source aligned along one axis and a turbo pump aligned along a different axis to provide accommodation of and facilitate access to all the chamber components. However, the off-set pump design is inherently non-symmetrical which may cause non-uniformity across the substrate being processed and cause particle problems because by-products from processing may be efficiently pumped out from all surfaces of the substrate and the processing chamber.

Therefore, there is a need for a processing chamber that enables symmetric flow.

SUMMARY

The present disclosure generally relates to apparatus and methods for symmetry in electrical field, gas flow and thermal distribution in a processing chamber to achieve process uniformity.

One embodiment of the present disclosure provides an apparatus for processing a substrate. The apparatus includes a chamber enclosure defining a processing volume having a central axis. The chamber enclosure has an opening formed through a bottom of the chamber enclosure, and the opening is substantially symmetrical about the central axis. The apparatus further includes a substrate support assembly disposed in the processing volume, a gas distribution assembly positioned to deliver one or more processing gas towards the supporting surface of the substrate support assembly in the processing volume, and a gate valve coupled to the opening of the chamber enclosure. The substrate support assembly has a supporting surface for positioning a substrate substantially symmetrical to the central axis, and the substrate support assembly is attached to a sidewall of the chamber enclosure.

Another embodiment of the present disclosure provides a substrate support assembly. The substrate support assembly includes an electrostatic chuck having a top surface for supporting a substrate, a support block comprising a disk for supporting the electrostatic chuck, and a mounting block attached to the disk for mounting the disk and the electrostatic chuck to a sidewall in a cantilever manner.

Yet another embodiment of the present disclosure provides a method for processing a substrate. The method includes positioning the substrate on a substrate support assembly disposed in a processing volume of a processing chamber. The processing volume is substantially symmetrical to a central axis, the substrate is positioned substantially symmetrical about the central axis, and the substrate support assembly is attached to a sidewall of the processing chamber in a cantilever manner. The method further includes delivering one or more processing gases to the processing volume through a gas distribution assembly positioned substantially symmetrical to the central axis while vacuuming the processing volume through a gate valve coupled to an opening on the processing chamber, wherein the opening is substantially symmetrical about the central axis.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to apparatus and methods for symmetry in electrical field, gas flow and thermal distribution in a processing chamber to achieve process uniformity. Embodiment of the present disclosure includes a plasma processing chamber having a plasma source, a substrate support assembly and a vacuum pump aligned along the same central axis to create substantially symmetrical flow paths, electrical field, and thermal distribution in the plasma processing chamber resulting in improved process uniformity and reduced skew. One embodiment includes a chamber liner designed to define a substantially symmetrical inner volume for substrate processing. The chamber liner may also provide interface for connecting with a vacuum pump system. In one embodiment, the chamber liner may be used to retro-fit into chamber bodies of existing non-symmetrical plasma chambers.

Figure 1A:
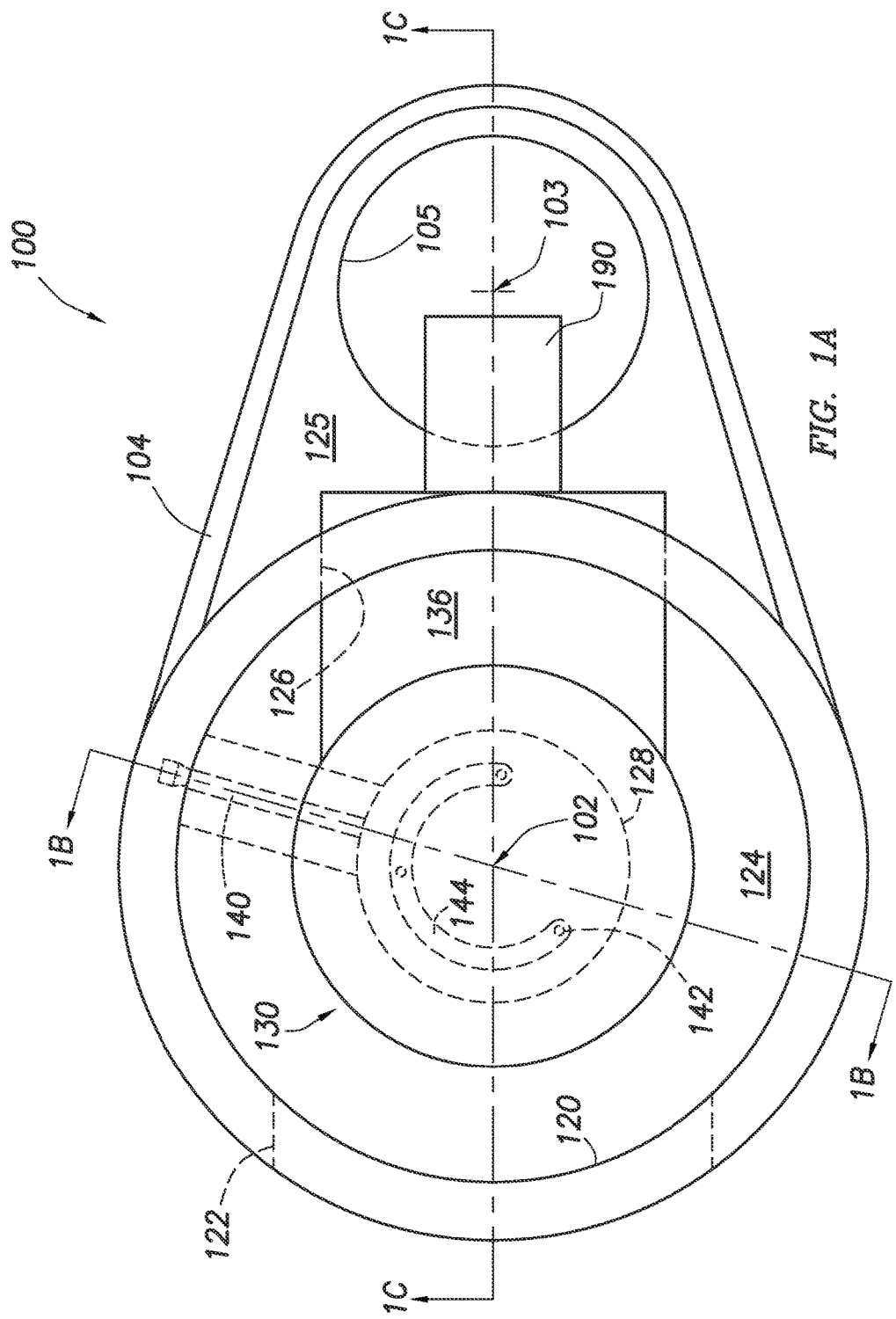
FIG. 1A is a schematic top view of a plasma processing chamber according to one embodiment of the present disclosure.
Figure 1B:
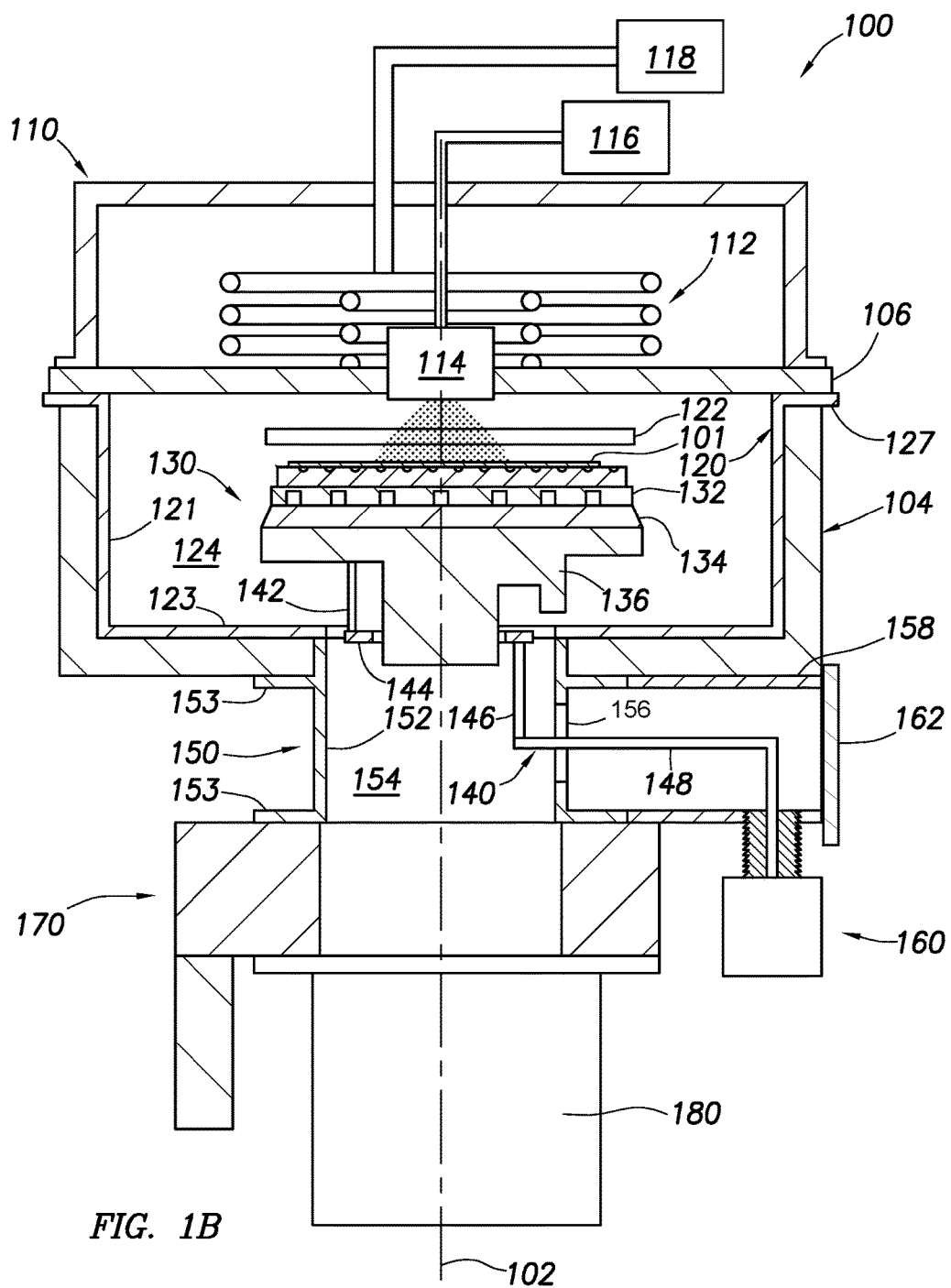
FIG. 1B is a sectional side view of the plasma processing chamber of FIG. 1A.
Figure 1C:
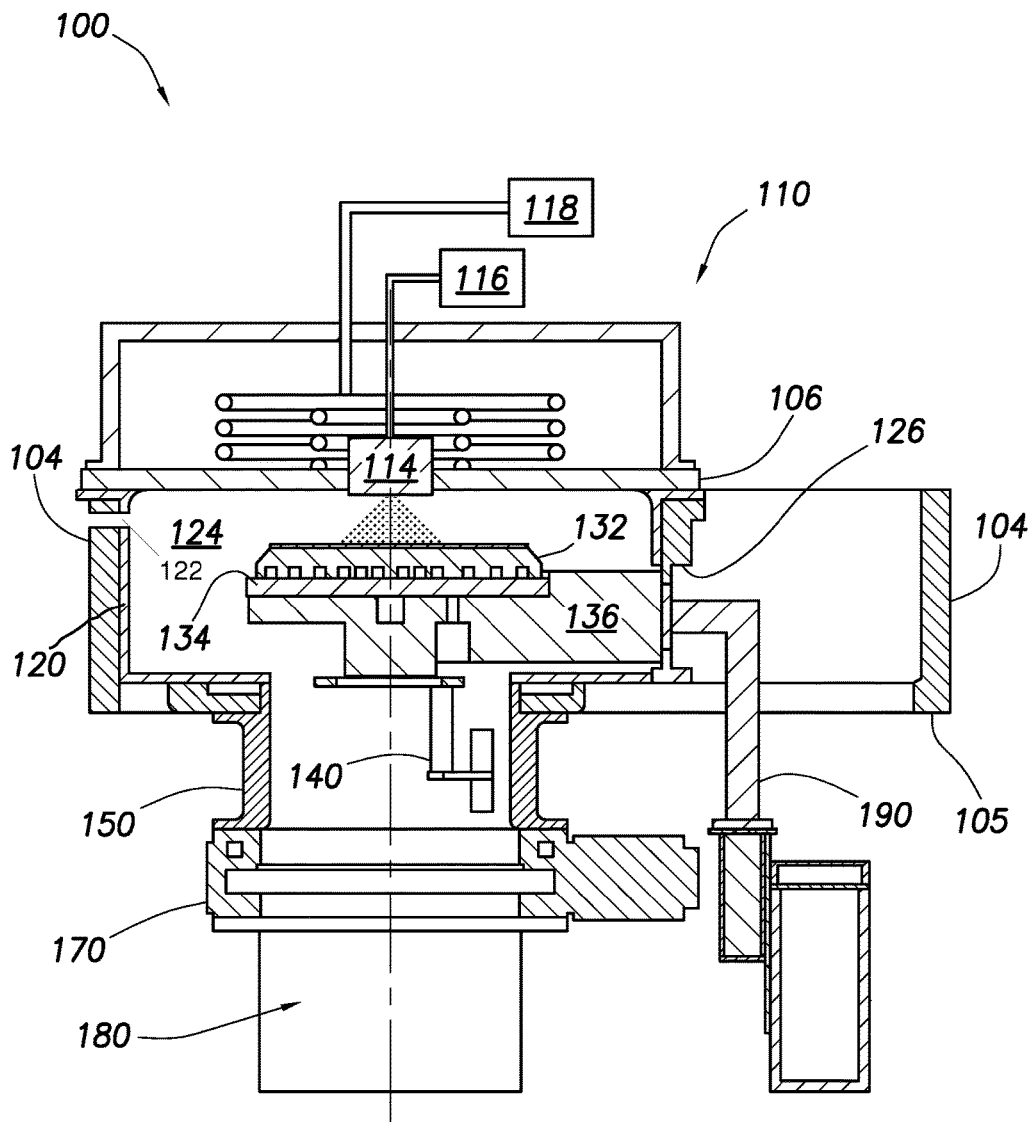
FIG. 1C is a second sectional side view of the plasma processing chamber of FIG. 1A.

FIGS. 1A-1C are schematic views of a plasma processing chamber 100 according to one embodiment of the present disclosure. The plasma processing chamber 100 improves process flow uniformity and conductance inside a processing chamber by aligning plasma source, substrate support assembly, throttle gate valve and vacuum pump along the same axis. In one embodiment, the plasma processing chamber 100 may be retrofitted from a chamber body of an existing plasma processing chamber with offset pump design.

FIG. 1A is a schematic top view of the plasma processing chamber 100 with a chamber lid 106 and a plasma source 110 removed. FIG. 1B is a sectional side view of the plasma processing chamber 100 providing details of a substrate lift assembly 140. FIG. 1C is a second sectional side view of the plasma processing chamber 100 providing details of a substrate support assembly 130. The plasma processing chamber 100 include a chamber enclosure having an inner volume substantially symmetrical to a central axis for improving process uniformity. In one embodiment, the chamber enclosure may include a chamber body 104 and a chamber liner 120 disposed inside the chamber body 104.

As shown in FIG. 1A, the chamber body 104 is a chamber body for a traditional pump offset processing chamber. The chamber body 104 is originally designed to have a substrate 101 positioned substantially symmetrical about a first axis 102 during processing. A pump port 105 may be formed through the chamber body 104 about a second axis 103 for pumping out the inner volume of the chamber body 104. The second axis 103 is off set from the first axis 102, as a result the processing environment created by the chamber body 104 is not symmetrical about the first axis 102, which is also the central axis of substrate 101 being processed. Embodiments of the present disclosure provide apparatus or methods for using the first axis 102 as a central axis for a substantial symmetrical processing.

The liner 120 is disposed inside the chamber body 104. The liner 120 separates the interior of the chamber body 104 into a processing volume 124 and an excluded volume 125. The processing volume 124 is enclosed by the liner 120 and is substantially symmetrical about the first axis 102. The excluded volume 125 is exterior to the liner 120. The liner 120 also excludes the pump port 105 from the processing volume 124. The substrate support assembly 130 is disposed in the processing volume 124 substantially symmetrical about the first axis 102 so that a substrate 101 may be substantially symmetrical to the first axis 102 during processing. As shown in FIGS. 1B and 1C, the plasma source 110, a throttle gate valve 170 and a vacuum pump 180 are also substantially symmetrically about the first axis 102.

The plasma source 110 may be disposed above the chamber lid 106. In one embodiment, the plasma source 110 may be an inductive coupled plasma source having one or more coils 112 connected to radio frequency (RF) power source 118. The one or more coils 112 may be disposed concentric to the first axis 102 for generating and maintaining a plasma in the processing volume 124 that is substantially symmetrical to the first axis 102. Other plasma sources may be used according to process requirement.

A gas delivery nozzle 114 may be disposed through the chamber lid 106 for distributing one or more processing gases from a gas panel 116 to the processing volume 124. The gas delivery nozzle 114 may be disposed symmetrically about the first axis 102 to enable symmetrical gas flow. Alternatively, other gas distribution devices, such as a showerhead, may be symmetrically positioned about the first axis 102 in place of the gas delivery nozzle 114.

The liner 120 may be shaped to enclose a symmetrical volume about the first axis 102 and to shield any asymmetrical features of the chamber body 104 from the substrate support assembly 130 disposed inside the liner 120. In FIGS. 1A-1C, the liner 120 has a substantially cylindrical sidewall 121 for defining a substantially cylindrical inner volume. A flange 127 may extend from an upper end of the cylindrical sidewall 121. The flange 127 allows the liner 120 to be mounted on the chamber body 104. A bottom 123 may be extended inwardly from the cylindrical sidewall 121. An opening 128 is formed through the bottom 123. The opening 128 allows the processing volume 124 to be in fluid communication with the throttle gate valve 170. The opening 128 may be formed symmetrically to the sidewall 121. A slit valve door opening 122 may be formed through the sidewall 121 to allow passage of the substrate 101. In one embodiment, as shown in FIG. 1C, a facility port 126 may be formed through the liner 120 to allow electrical, gaseous, fluid and other connections between the substrate support assembly 130 and exterior of the liner 120. In one embodiment, the facility port 126 may be formed facing the pump port 105 of the chamber body 104 so that facilities of the substrate support assembly 130 may come through the pump port 105.

The substrate support assembly 130 may includes an electrostatic chuck 132 for supporting and securing the substrate 101 during processing. The electrostatic chuck 132 may be formed from a dielectric material having electrodes and/or heaters embedded therein. The electrostatic chuck 132 may be disposed on a facility plate 134. The facility plate 134 may include features to provide electrical connection, gas supply, temperature control to the electrostatic chuck 132. The electrostatic chuck 132 and the facility plate 134 may be stacked over a support block 136. The support block 136 may include interfaces and channels to allow electrical, gaseous, and fluid communication to the electrostatic chuck 132 and the facility plate 134.

In one embodiment, the support block 136 may be secured to the liner 120 in a cantilever fashion to allow the electrostatic chuck 132 to be centered along the first axis 102 with substantially the same amount of spacing to the sidewall 121 along the edge region of the electrostatic chuck 132. As shown in FIG. 1C, the support block 136 may be secured to the liner 120 at the facility port 126. A facility duct 190 may be attached to the support block 136 for providing electrical, gaseous, and fluid communication to the electrostatic chuck 132 and the facility plate 134. In one embodiment, the facility duct 190 may extend out of the chamber body 104 through the pump port 105.

As shown in FIG. 1B, the support block 136, the facility plate 134 and the electrostatic chuck 132 "suspend" above the bottom 123 of the liner 120 so that processing gases can flow from the substrate 101 being processed radially outward towards the edge region of the substrate support assembly 130 downward to the opening 128 through the bottom 123 of the liner 120 to exit the processing volume 124. Thus flow paths substantially symmetrical to the first axis 102 are created by positioning the substrate support assembly 130 and the liner 120 substantially symmetrical about the first axis 102.

In one embodiment, an extension spool 150 may be extended downward from the chamber body 104 to provide an interface between the chamber body 104 and the throttle gate valve 170. The extension spool 150 may also provide a vertical space to accommodate a substrate lift assembly 140 for lifting the substrate 101 from the substrate support assembly 130. The extension spool 150 may have a cylindrical wall 152 enclosing a cylindrical inner volume 154. The extension spool 150 may include flanges 153 for mounting on the chamber body 104 and the throttle gate valve 170. The extension spool 150 is disposed substantially symmetrical to the first axis 102 to further extend the symmetry of the plasma processing chamber 100.

In one embodiment, the extension spool 150 may include an extension arm 158 extending radially outward. The extension arm 158 may be a casing attached to the cylindrical wall 152. The extension arm 158 may be used to house a portion of the substrate lift assembly 140. A lift assembly port 156 may be formed through the cylindrical wall 152.

The substrate lift assembly 140 may include a plurality of lift pins 142 supported by a hoop 144. The lift pins 142 may be movable through lift pins holes (not shown) formed through the substrate support assembly 130 to selectively lift the substrate 101 from the substrate support assembly 130. The hoop 144 may be mounted on a supporting post 146. The supporting post 146 may be connected to a cantilever arm 148 extended to the cylindrical inner volume 154 from the extension arm 158. A lift pin driving mechanism 160 may be connected to the extension arm 158 to drive to move the lift pins 142 vertically. A cover 162 may be attached to the extension arm 158 to provide a vacuum seal.

The throttle gate valve 170 and the vacuum pump 180 are disposed substantially symmetrical to the first axis 102 to achieve substantial symmetrical fluid flow.

Figure 2A:
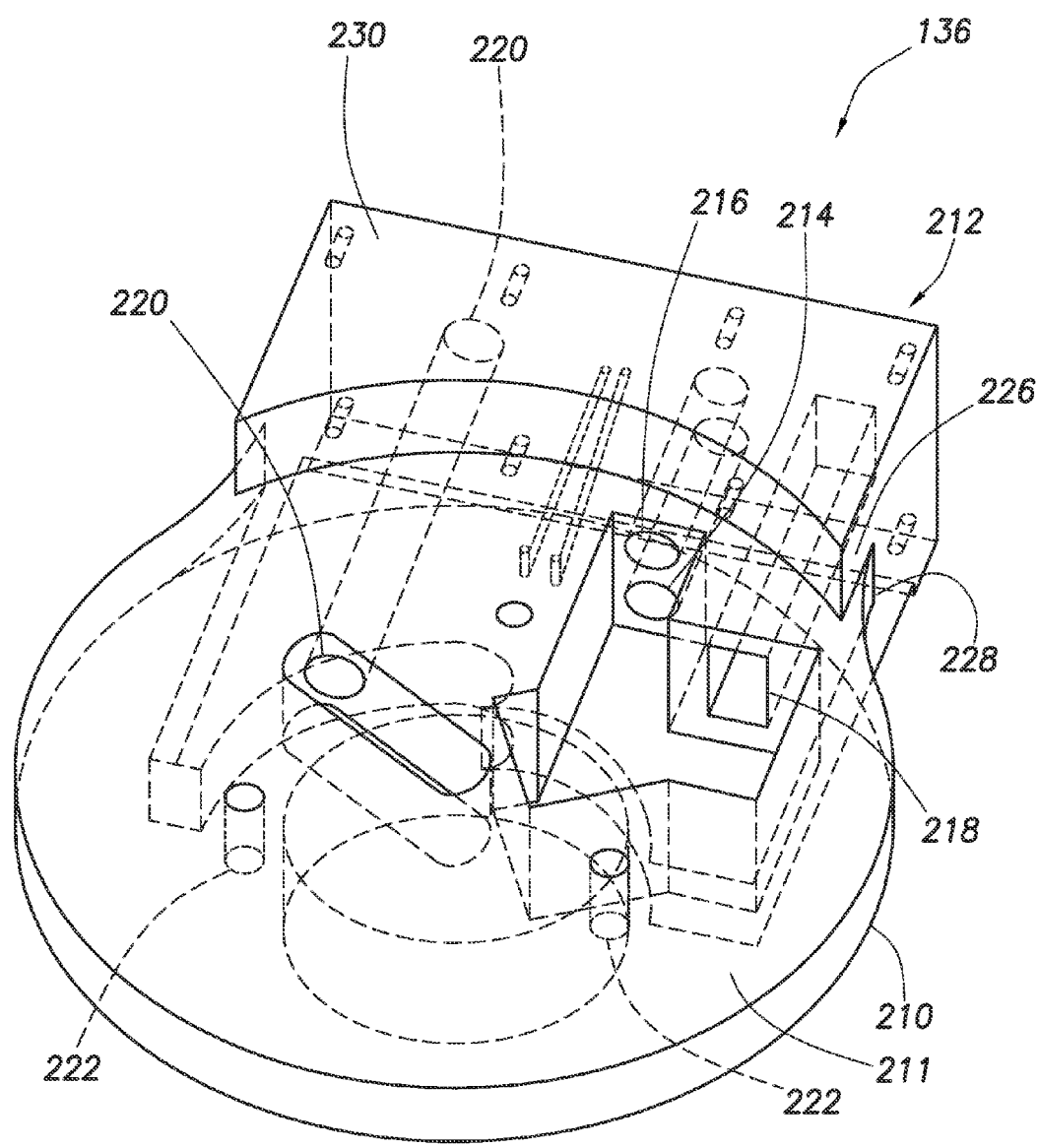
FIG. 2A is a schematic perspective top view of a support block according to one embodiment of the present disclosure.
Figure 2B:
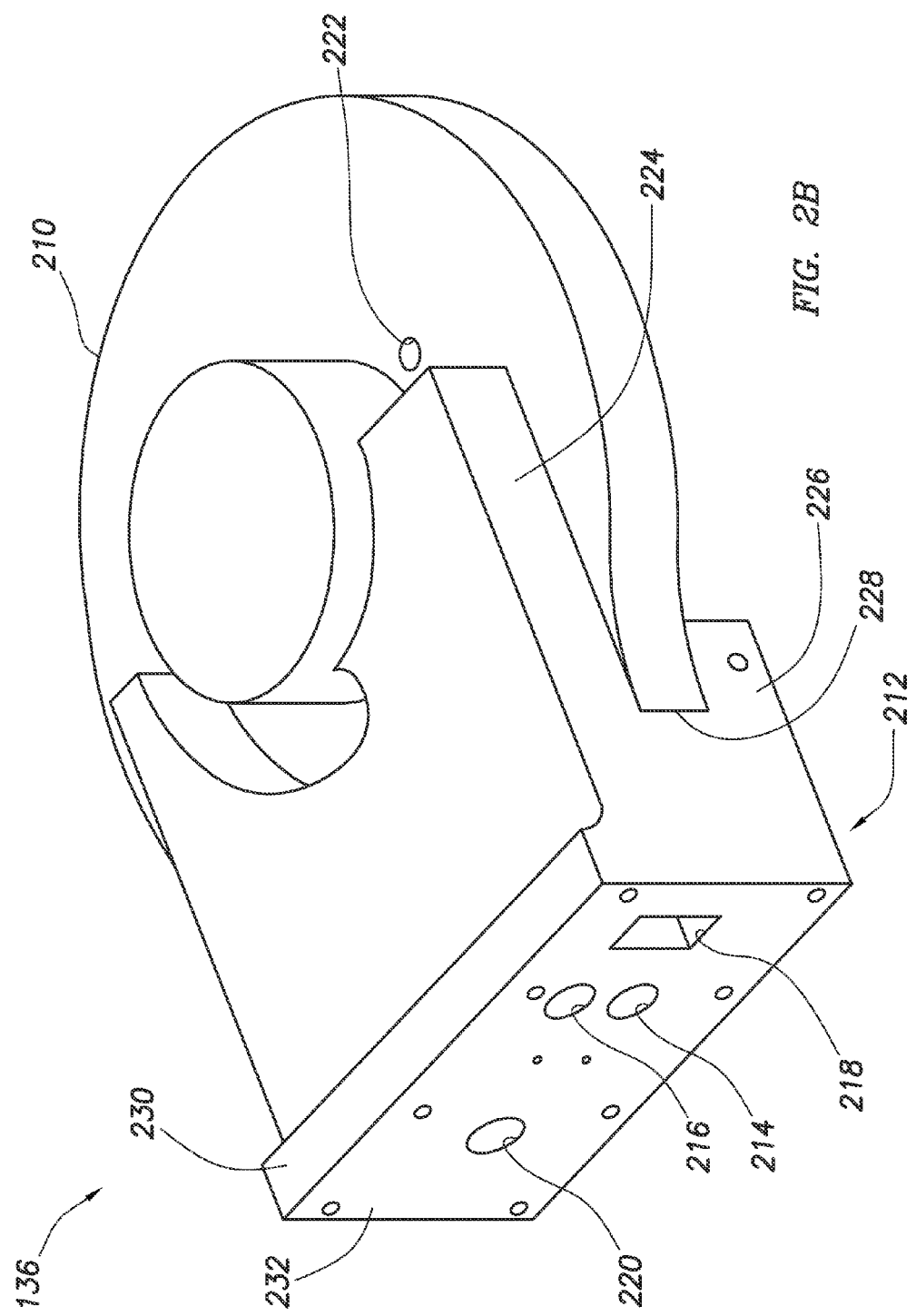
FIG. 2B is a schematic perspective bottom view of the support block of FIG. 2A.

FIG. 2A is a schematic perspective top view of the support block 136 according to one embodiment of the present disclosure. FIG. 2B is a schematic perspective bottom view of the support block 136. The support block 136 may include a disk 210 having a top surface 211 for receiving and supporting the facility plate 134. A plurality of lift pin holes 222 may be formed through the disk 210. The disk 210 is secured to a mounting block 212. The mounting block 212 may include an outer portion 230 and a lower arm 224 and an upper arm 226 extending from the outer portion 230. A gap 228 is formed between the lower arm 224 and the upper arm 226. The disk 210 may be fitted in the gap 228. The lower arm 224 is longer than the upper arm 226 and functions as a cantilever to support the disk 210. The upper arm 226 is short to allow a circular area of the top surface 211 to be exposed for receiving the facility plate 134. The mounting block 212 may be disposed through the facility port 126 of the liner 120 so that the outer portion 230 is positioned outside the liner 120. The outer portion 230 may have an interface 232. Cooling channels 214, 216, a gas duct 218, an electrical duct 220, and other interfaces may be formed from the interface 232 through the support block 136. As shown in FIG. 2A, the cooling channels 214, 216, the gas duct 218, the electrical duct 220 open at the top surface 211 of the disk 210 to be further connected with the facility plate 134.

Figure 3:
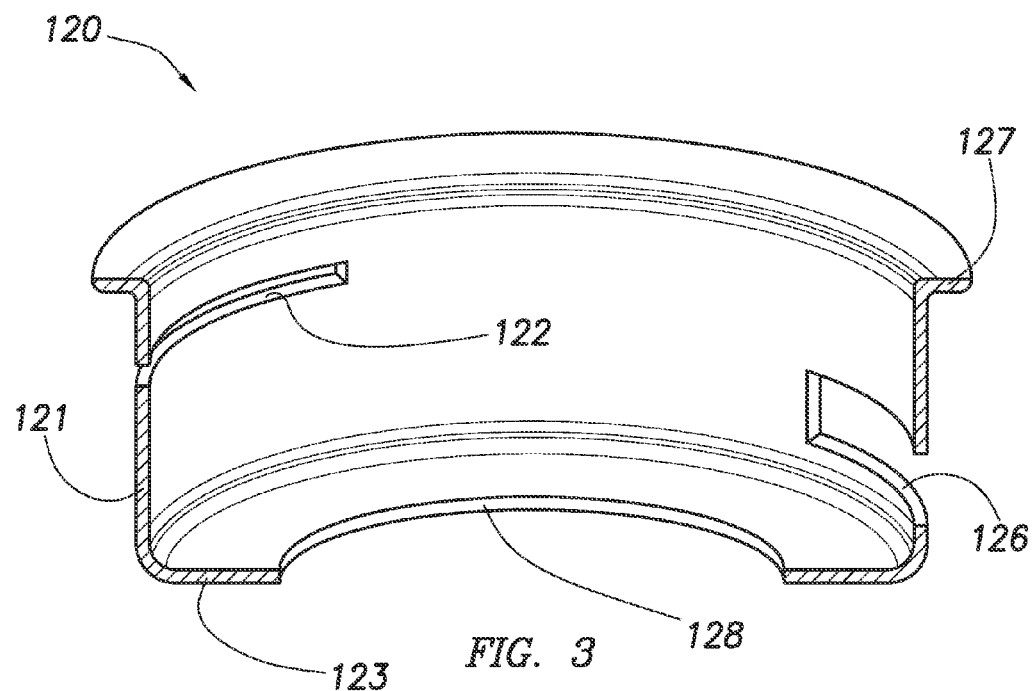
FIG. 3 is a schematic perspective sectional view of a chamber liner according to one embodiment of the present disclosure.

FIG. 3 is a schematic perspective sectional view of the chamber liner 120 according to one embodiment of the present disclosure. The chamber liner 120 defines a substantially symmetrical inner volume for substrate processing. In one embodiment, the chamber liner 120 may be formed materials that are compatible with processing chemistry. In one embodiment, the chamber liner 120 may be formed from ceramic, such as silicon carbide.

Figure 4:
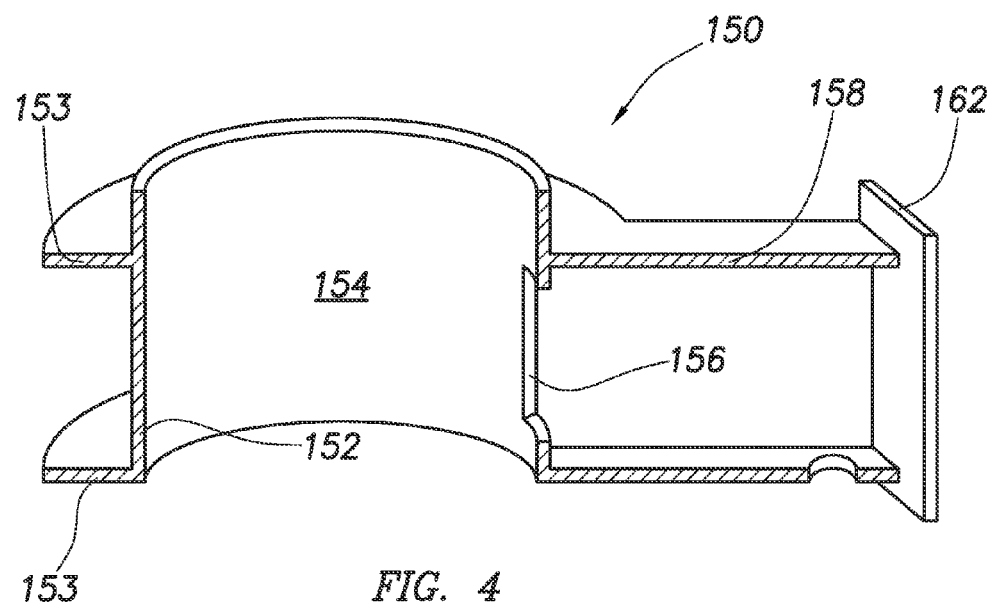
FIG. 4 is a schematic perspective sectional view of a spool according to one embodiment of the present disclosure.

FIG. 4 is a schematic perspective sectional view of the extension spool 150. The lift assembly port 156 may be a small vertical slit with minimum disturbance to the symmetry of the cylindrical inner volume 154.

Figure 5:
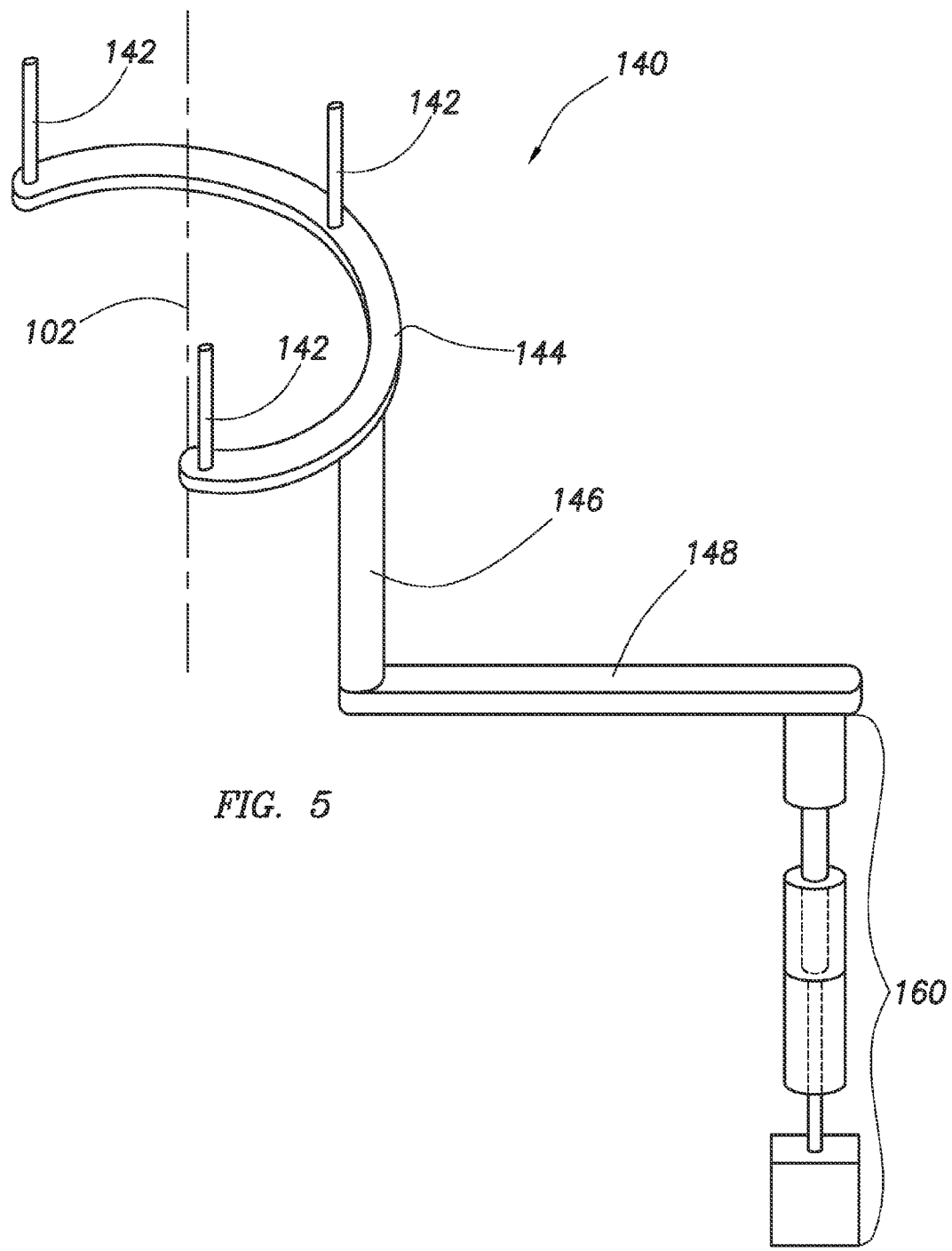
FIG. 5 is a schematic perspective view of a lift pin assembly according to one embodiment of the present disclosure.

FIG. 5 is a schematic perspective view of the substrate lift assembly 140. The cantilever design of the substrate lift assembly 140 positions the lift pin driving mechanism 160 away the axis 102 enabling symmetrical flow paths.

Even though embodiments of the present disclosure are described in association with a chamber body with pump port—substrate support offset, embodiments of the present disclosure may be used to improve symmetry in any chamber bodies.

Even though, embodiments of the present disclosure are described in association with an inductive coupled plasma chamber, embodiments of the present disclosure may be used to improve symmetry and reduce skew in any processing chambers.

While the foregoing is directed to embodiments of the present disclosure, other and further embodiments of the disclosure may be devised without departing from the basic scope thereof, and the scope thereof is determined by the claims that follow.

The invention claimed is:

1. An apparatus for processing a substrate, comprising:
   a chamber body having a central axis, wherein an opening is formed through a bottom of the chamber body about the central axis;
   a liner disposed inside the chamber body, wherein the liner includes a substantially cylindrical sidewall, the liner separates an inner volume of the chamber body into a processing volume and an excluded volume, the excluded volume is eccentric to the processing volume, and the cylindrical sidewall is positioned substantially symmetrical about the central axis;
   a pump port formed in the chamber body in fluid communication with the excluded volume, wherein the liner excludes the pump port from the processing volume;
   a facility port formed through the cylindrical sidewall of the liner and oriented facing the pump port;
   a substrate support assembly disposed in the processing volume, wherein the substrate support assembly has a supporting surface for positioning a substrate substantially symmetrical to the central axis, and the substrate support assembly is attached to the liner at the facility port such that facilities of the substrate support assembly pass through the pump port via the facilities port;
   a gas distribution assembly positioned to deliver one or more processing gas towards the supporting surface of the substrate support assembly in the processing volume; and
   a gate valve connected to the opening of the chamber body.

2. The apparatus of claim 1, wherein the liner includes a bottom extended inwardly from the cylindrical sidewall, and the substrate support assembly is suspended above the bottom.

3. The apparatus of claim 2, wherein the pump port is formed through the bottom of the chamber body along a second axis, and an inner volume of the chamber body is non-symmetrical about the central axis.

4. The apparatus of claim 1, further comprises:
   a lift assembly disposed under the substrate support assembly, wherein the lift assembly is operable to move a plurality of lift pins through lift pin holes in the substrate support assembly; and
   a vacuum pump coupled to the gate valve in the bottom of the chamber body.

5. The apparatus of claim 4, wherein the lift assembly comprises:
a hoop, wherein the plurality of lift pins are mounted on the hoop;
an arm connected with the hoop; and
a driving mechanism coupled to the arm to move the hoop along a vertical direction.

6. The apparatus of claim 5, further comprising:
an extension spool connected between the opening of the chamber body and the gate valve, wherein the extension spool defines a cylindrical inner volume, and the cylindrical inner volume is connected to the processing volume through the opening of the chamber body.

7. The apparatus of claim 6, wherein the extension spool comprises:
a cylindrical sidewall, wherein a lift assembly port is formed through the cylindrical sidewall; and
an extension arm extending radially outward from the lift assembly port of the cylindrical sidewall, wherein the arm of the lift assembly is disposed in the extension arm and enters the cylindrical inner volume of the extension spool through the lift assembly port.

8. The apparatus of claim 1, wherein the substrate support assembly comprises:
an electrostatic chuck having a top surface for supporting a substrate; and
a support block comprising:
a disk for supporting the electrostatic chuck in the processing volume; and
a mounting block mounted on the sidewall of the liner, wherein the disk is attached to the mounting block.

9. The apparatus of claim 8, wherein the mounting block comprises: an outer portion for securing the mounting block to the liner; an upper arm attached to the outer portion; and a lower arm attached to the outer portion below the upper arm, wherein a gap is formed between the upper arm and the lower arm, and the disk is secured in the gap.

10. The apparatus of claim 8, wherein the mounting block includes one or more channels for providing one or more of electrical, gaseous and fluid communication to the substrate support assembly.

11. The apparatus of claim 10, wherein the substrate support assembly further comprising:
a facility plate stacked between the electrostatic chuck and the support block.

12. The apparatus of claim 10, further comprising a facility duct attached to the mounting block.

13. The apparatus of claim 1, further comprising a plasma source disposed above the chamber body, wherein the plasma source is positioned symmetrically about the central axis.

14. The apparatus of claim 12, wherein the pump port is formed through the bottom of the chamber body along a second axis, an inner volume of the chamber body is non-symmetrical about the central axis, and the facility duct extends out of the chamber body through the pump port.

15. The apparatus of claim 2, wherein the liner includes a flange extending from an upper end of the cylindrical sidewall, and the liner is mounted to the chamber body at the flange.

16. An apparatus for processing a substrate, comprising:
a chamber body defining an inner volume;
a liner disposed in the inner volume of the chamber body, wherein the liner includes a substantially cylindrical sidewall and an opening formed in a bottom of the liner about a first axis, the liner separates the inner volume of the chamber body into a cylindrical process volume and an excluded volume, the excluded volume is eccentric to the process volume, and the opening is in fluid communication with the process volume;
a pump port formed through a bottom wall of the chamber body about a second axis, the second axis eccentric to the first axis, wherein the pump port is in fluid communication with the excluded volume and the liner excludes the pump port from the process volume;
a facility port is formed through the cylindrical sidewall of the liner and oriented facing the pump port;
a vacuum pump coupled to the opening;
a substrate support assembly disposed in the cylindrical process volume, wherein the substrate support assembly comprises:
an electrostatic chuck having a top surface for supporting a substrate; and
a support block secured to the liner at the facility port such that facilities of the substrate support assembly pass through the pump port via the facility port.

17. The apparatus of claim 16, wherein the liner includes:
a flange extending from an upper end of the cylindrical sidewall, and the liner is mounted to the chamber body at the flange.

18. The apparatus of claim 17, wherein the bottom of the liner extends inwardly from the cylindrical sidewall and the substrate support assembly is suspended above the bottom.

19. The apparatus of claim 16, further comprising
an extension spool connected to the opening of the liner, wherein the extension spool defines a cylindrical inner volume and is connected to the vacuum pump.

20. The apparatus of claim 19 further comprises:
a lift assembly disposed under the substrate support assembly, wherein the lift assembly comprises:
a hoop movably disposed in the extension spool, wherein a plurality of lift pins are mounted on the hoop;
an arm connected with the hoop; and
a driving mechanism coupled to the arm to move the hoop along a vertical direction.

* * * * *